United States Patent
Yang (10) Patent No.: US 7,880,263 B2
(45) Date of Patent: Feb. 1, 2011

(54) METHOD AND RESULTING STRUCTURE DRAM CELL WITH SELECTED INVERSE NARROW WIDTH EFFECT

(75) Inventor: Hae Wang Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 198 days.

(21) Appl. No.: 12/238,256

(22) Filed: Sep. 25, 2008

(65) Prior Publication Data

US 2010/0001367 A1  Jan. 7, 2010

(30) Foreign Application Priority Data

Jul. 3, 2008   (CN) .................. 2008 1 0040296

(51) Int. Cl.
*H01L 29/00*   (2006.01)
*H01L 21/76*   (2006.01)

(52) U.S. Cl. .................................................. 257/510
(58) Field of Classification Search .......... 438/424, 438/524, 528, 224, 243, 433, 270, 289, 460, 438/437, 766, 246, 251, 252, 740, 305–306, 438/388–391, 426–427, 429, 434–435, 444, 438/450–452, 504–506, 514, 527, 548, 589, 438/673, 700, 713, 734, 738; 257/68–71, 257/296–309, 905–908, E27.098–E27.101, 257/E27.077, 314–326, 27.078, E29.3–E29.309, 257/118, 244, 328–33, 466, 513, 594, 510
See application file for complete search history.

(56) References Cited

U.S. PATENT DOCUMENTS

| | | | |
|---|---|---|---|
| 6,562,697 B1 | 5/2003 | Cho et al. | |
| 6,599,810 B1 | 7/2003 | Kepler et al. | |
| 6,890,832 B1 * | 5/2005 | Kerwin et al. | 438/425 |
| 6,924,182 B1 * | 8/2005 | Xiang et al. | 438/197 |
| 7,029,997 B2 * | 4/2006 | Wu | 438/514 |
| 7,045,436 B2 * | 5/2006 | Chatterjee et al. | 438/433 |

(Continued)

OTHER PUBLICATIONS

Office Action of Chinese Application No. 200810040296.4, dated Mar. 19, 2010, 4 pages total (English translation not included).

*Primary Examiner*—Dao H Nguyen
*Assistant Examiner*—Tram H Nguyen
(74) *Attorney, Agent, or Firm*—Townsend and Townsend and Crew LLP (57) ABSTRACT

A shallow trench isolation structure for integrated circuits. The structure includes a semiconductor substrate and a buffered oxide layer overlying the semiconductor substrate. A pad nitride layer is overlying the buffered oxide layer. An implanted region is formed around a perimeter of the trench region. A trench region is formed within the semiconductor substrate. The trench region has a bottom width of less than 0.13 microns and an upper width of less than 0.13 microns. A rounded edge region is within a portion of the semiconductor substrate surrounding a periphery of the trench region. The rounded edges have a radius of curvature greater than about 0.02 um. A planarized high density plasma fill material is formed within the trench region. The structure has a P-well region within the semiconductor substrate and bordering a vicinity of the trench region. A channel region is within the P-well region within the semiconductor substrate. The implanted region has a concentration of more than double an amount of impurities as impurities in the channel region.

19 Claims, 6 Drawing Sheets

U.S. PATENT DOCUMENTS 7,300,848 B2 * 11/2007 Jang .......................... 438/302
2004/0102017 A1 * 5/2004 Chang et al. ................ 438/424
2004/0203216 A1 * 10/2004 Lin et al. .................... 438/424
2009/0315115 A1 * 12/2009 Zhang et al. ................ 257/368

* cited by examiner

METHOD AND RESULTING STRUCTURE DRAM CELL WITH SELECTED INVERSE NARROW WIDTH EFFECT

CROSS-REFERENCES TO RELATED APPLICATIONS

This application claims priority to Chinese Application No. 200810040296.4, filed Jul. 3, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and structures for manufacturing an isolation structure for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of isolation structures for memory devices, such as dynamic random access memory integrated circuits. Such isolation structures include, among others, local oxidation of silicon, commonly called LOCOS, and shallow trench isolation, called STI. Although there have been significant improvements, such designs still have many limitations. As merely an example, these designs must become smaller and smaller but still provide electrical isolation characteristics. Additionally, these isolation structures are often difficult to manufacture and generally require complex manufacturing processes and structures. Furthermore these memory devices often have problems called inverse narrow width effects, commonly known as INWE. These and other limitations will be described in further detail throughout the present specification and more particularly below.

From the above, it is seen that an improved technique for processing semiconductor devices is desired.

SUMMARY OF THE INVENTION

According to the present invention, techniques for processing integrated circuits for the manufacture of semiconductor devices are provided. More particularly, the invention provides a method and structures for manufacturing an isolation structure for dynamic random access memory devices, commonly called DRAMs. But it would be recognized that the invention has a much broader range of applicability.

In a specific embodiment, the present invention provides a method for a shallow trench isolation structure for integrated circuits, e.g., dynamic random access memory device. The method includes providing a semiconductor substrate e.g., silicon wafer. The method forms a buffered oxide layer overlying the semiconductor substrate and forms a pad nitride layer overlying the buffered oxide layer. The method also includes patterning the pad nitride layer to expose a portion of the semiconductor substrate corresponding to a trench region. The method implants P-type material using the patterned pad nitride layer using an angle of implanting of less than 45 degrees to form an implanted region around a perimeter of the trench region. The method includes forming a blanket layer of oxide material overlying the patterned nitride layer and implanted region of the semiconductor substrate. The method selectively removes the oxide material to leave side wall spacers on edges of the pad nitride layer facing the exposed portion of the semiconductor substrate. The method uses the patterned pad nitride and side wall spacers as a protective layer and etches the exposed portion of the semiconductor substrate to form a trench region within the semiconductor substrate. Preferably, the trench region has a depth of no greater than 2500 Angstroms and a bottom width of at less than 0.13 microns and an upper width of less than 0.13 microns. The side wall spacers are selectively removed on edges of the pad nitride. The method performs a soft etch on edges of the trench region to round the edges. Preferably, sharp edges (e.g., 90 degree corners or thin corner regions (e.g., 0.01 um microns and less)) are reduced to round edges on the periphery of the trench region. The method performs a high density plasma chemical vapor deposition process to fill the trench region with a dielectric material. The method planarizes the high density plasma chemical vapor deposition process dielectric material until a portion of the patterned pad nitride layer has been exposed. The patterned pad nitride layer is stripped. The method forms P-well regions within the semiconductor substrate and forms channel regions using boron bearing species within the semiconductor substrate.

In an alternative specific embodiment, the present invention provides a method for a shallow trench isolation structure for integrated circuits, e.g., dynamic random access memory device. The method includes providing a semiconductor substrate, e.g., silicon wafer. The method forms a buffered oxide layer overlying the semiconductor substrate and forms a pad nitride layer overlying the buffered oxide layer. The method also includes patterning the pad nitride layer to expose a portion of the semiconductor substrate corresponding to a trench region. Preferably, the trench region has a bottom width of less than 0.13 microns and an upper width of less than 0.13 microns. The method implants P-type material using the patterned pad nitride layer using an angle of implanting of less than 45 degrees to form an implanted region (e.g., continuous) around a perimeter of the trench region. The method includes forming a blanket layer of oxide material overlying the patterned nitride layer and implanted region of the semiconductor substrate. The method selectively removes the oxide material to leave side wall spacers on edges of the pad nitride layer facing the exposed portion of the semiconductor substrate. The method uses the patterned pad nitride and side wall spacers as a protective layer to etch the exposed portion of the semiconductor substrate to form a trench region within the semiconductor substrate. The side wall spacers are selectively removed on edges of the pad nitride. The method performs a soft etch on edges of the trench region to round the edges, which include a radius of curvature greater than about 0.02 um. The method performs a high density plasma chemical vapor deposition process to fill the trench region and planarizes the high density plasma chemical vapor deposition process to expose the patterned pad nitride layer. The patterned pad nitride layer is stripped. The method forms P-well regions within the semiconductor substrate and forms channel regions using boron bearing species within the semiconductor substrate. Preferably, the implanted region has a selected concentration of more than double an amount of impurities implanted into the channel region.

In yet an alternative specific embodiment, the invention provides a shallow trench isolation structure for integrated circuits. The structure includes a semiconductor substrate and a buffered oxide layer overlying the semiconductor substrate. A pad nitride layer is overlying the buffered oxide layer. An implanted region is formed around a perimeter of the trench region. A trench region is formed within the semiconductor substrate. The trench region has a bottom width of less than 0.13 microns and an upper width of less than 0.13 microns. A rounded edge region is within a portion of the semiconductor substrate surrounding a periphery of the trench region. The rounded edges have a radius of curvature greater than about 0.02 um. A planarized high density plasma fill material is formed within the trench region. The structure has a P-well region within the semiconductor substrate and bordering a vicinity of the trench region. A channel region is within the P-well region within the semiconductor substrate. The implanted region has a concentration of more than double an amount of impurities as impurities in the channel region.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for improved process integration for design rules of 0.13 microns and less. Additionally, the invention provides isolation structures that may achieve improved electrical characteristics. Preferably, the invention may prevent inverse narrow width effects, commonly called INWE. In certain embodiments, the invention provides for a higher threshold voltage under a small amount of channel dosages. The higher amount of channel dosages in conventional devices causes higher electric fields between a storage node and channel of a dynamic random access memory cell. The higher electric fields are often undesirable. The present invention may achieve lower electric fields between the storage node and channel, which provides improved data retention. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for manufacturing an isolation structure for dynamic random access memory devices, commonly called DRAMs. But it would be recognized that the invention has a much broader range of applicability.

A method for fabricating a shallow trench isolation structure for integrated circuits can be briefly outlined below.

1. Provide a semiconductor substrate, e.g., silicon wafer;
2. Form a buffered oxide layer overlying the semiconductor substrate;
3. Form a pad nitride layer overlying the buffered oxide layer;
4. Pattern the pad nitride layer to expose a portion of the semiconductor substrate corresponding to a trench region;
5. Implant P-type material using the patterned pad nitride layer as a masking material at an angle of implanting of less than 45 degrees to form an implanted region around a perimeter of the trench region;
6. Form a blanket layer of oxide material overlying the patterned nitride layer and implanted region of the semiconductor substrate;
7. Selectively remove the oxide material to leave side wall spacers on edges of the pad nitride layer facing the exposed portion of the semiconductor substrate;
8. Use the patterned pad nitride and side wall spacers as a protective layer;
9. Etch the exposed portion of the semiconductor substrate to form a trench region within the semiconductor substrate;
10. Selectively remove the side wall spacers on edges of the pad nitride;
11. Perform a soft etch on edges of the trench region to round the edges, which include a radius of curvature greater than about 0.02 um;
12. Perform a high density plasma chemical vapor deposition process to fill the trench region;
13. Planarize the high density plasma chemical vapor deposition process until a portion of the patterned pad nitride layer has been exposed;
14. Strip the patterned pad nitride layer;
15. Form P-well regions within the semiconductor substrate;
16. Form channel regions using boron bearing species within the semiconductor substrate, whereupon the implanted region has a selected concentration of more than double an amount of impurities implanted into the channel region;

17. Perform other steps, as desired.

The above sequence of steps provides a method according to an embodiment of the present invention. As shown, the method uses a combination of steps including a way of forming an isolation region of a dynamic random access memory device. Of course, other alternatives can also be provided where steps are added, one or more steps are removed, or one or more steps are provided in a different sequence without departing from the scope of the claims herein. Further details of the present method can be found throughout the present specification and more particularly below.

Figure 1:
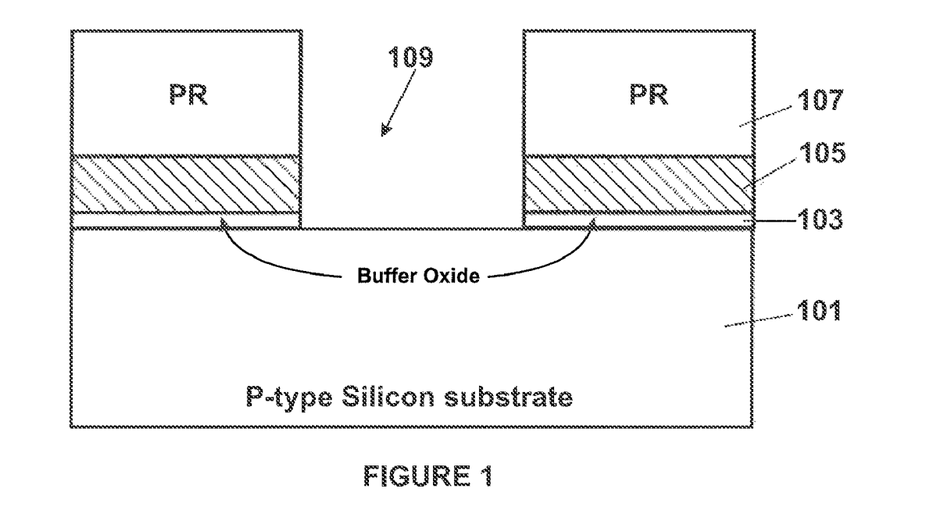
FIGS. 1 through 10 are simplified diagrams illustrating methods for fabricating an isolation structure for a dynamic random access memory device according to embodiments of the present invention.

FIGS. 1 through 10 are simplified diagrams illustrating methods for fabricating an isolation structure for a dynamic random access memory device according to embodiments of the present invention. These diagrams are merely examples that should not unduly limit the scope of the claims herein. One of ordinary skill in the art would recognize other variations, modifications, and alternatives. As shown in FIG. 1, the method includes providing a semiconductor substrate 101, e.g., silicon wafer, silicon on insulator. The method forms a buffered oxide layer 103 (e.g., thermal oxide) overlying the semiconductor substrate and forms a pad nitride layer 105 (or other like material) overlying the buffered oxide layer. The method also includes patterning the pad nitride layer to expose a portion 109 of the semiconductor substrate corresponding to a trench region. The patterning process uses photolithography layer 107, which has been provided using well known techniques.

Figure 2:
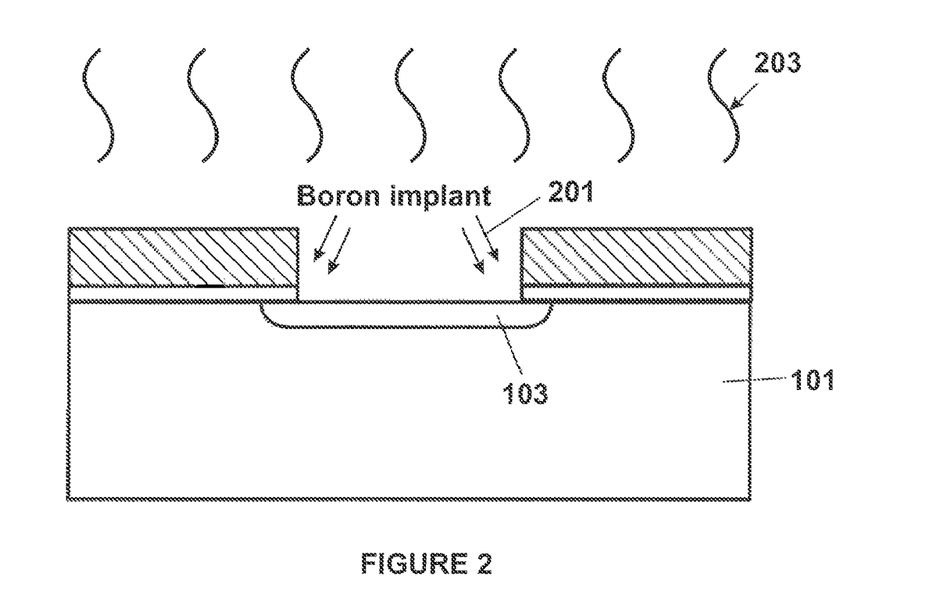

Referring to FIG. 2, the method implants P-type material 201 using the patterned pad nitride layer as a masking layer. Preferably, the method uses an angle of implanting of less than 45 degrees or others to form an implanted region 103 around a perimeter to the trench region. Preferably, implanting of the P-type material uses boron bearing impurities at a concentration ranging from about 1.0 e11 to about 5.0 e13 atoms/cm$^2$ and at 30 keV or other suitable energy. Preferably, the implanted region is subjected to annealing, including rapid thermal annealing and/or furnace annealing 203. The rapid thermal anneal is provided at a temperature of about 850 Degree Celsius to about 1050 Degree Celsius, but can be others. Furnace annealing occurs at about 850 C for about 10 to about 20 minutes.

Figure 3:
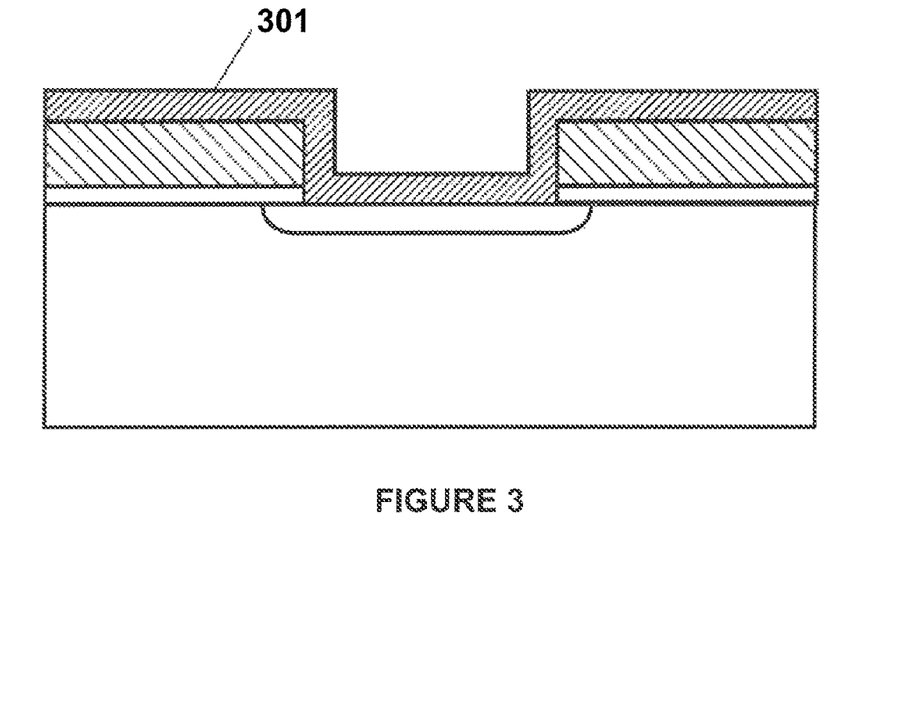
Figure 4:
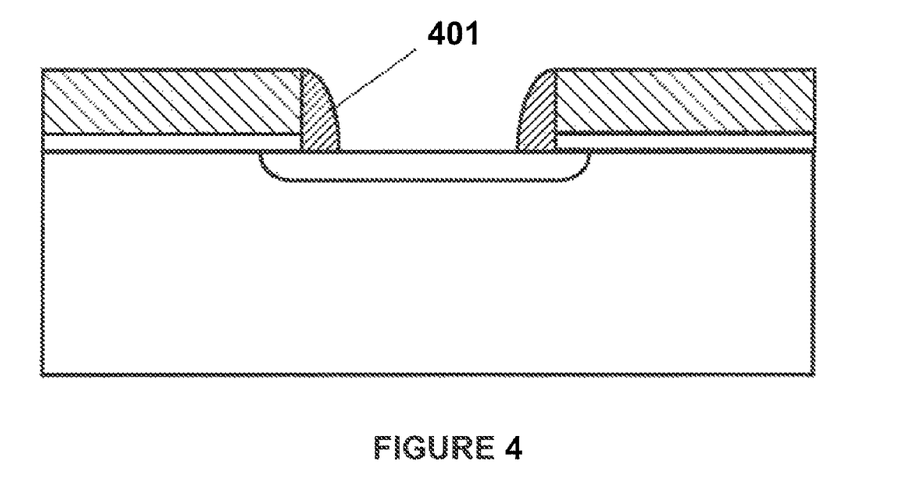

The method includes forming a blanket oxide layer 301 overlying the patterned pad nitride layer and the implanted region of the semiconductor substrate, as shown in FIG. 3. The blanket oxide layer is formed using a CVD process and has a thickness of about 100 Angstroms to about 500 Angstroms. The method selectively removes the blanket oxide layer to form side wall spacers 401 (FIG. 4) on edges of the patterned pad nitride layer facing the exposed portion of the semiconductor substrate. Preferably, an anisotropic etching technique can been used. The anisotropic etching techniques uses suitable bearing species under a plasma environment.

Figure 5:
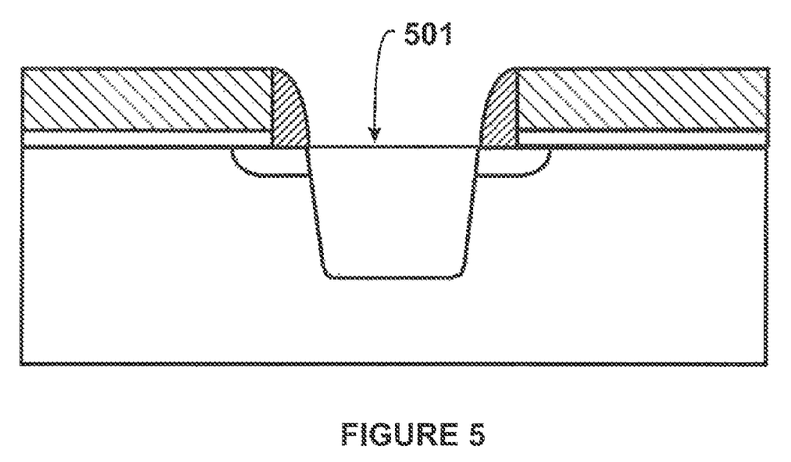
Figure 6:
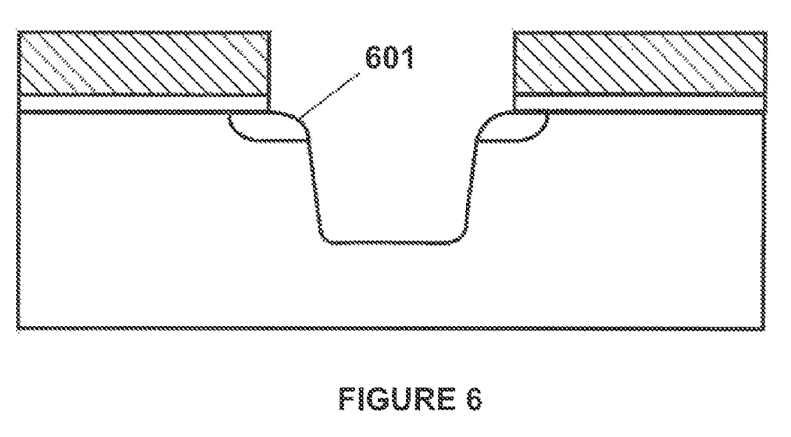

The method uses the patterned pad nitride and side wall spacers as a protective layer to etch the exposed portion 501 of the semiconductor substrate to form a trench region within the semiconductor substrate, as illustrated by FIG. 5. Preferably, the trench region has a depth of no greater than 2500 Angstroms and a bottom width of at less than 0.13 microns and an upper width of less than 0.13 microns. The side wall spacers are selectively removed on edges of the pad nitride, as shown in FIG. 6. Next, the method performs a soft etch on edges of the trench region to round the edges, which include a radius of curvature greater than about 0.02 um in a specific embodiment. The soft etch is performed using an anisotropic dry etch process.

Figure 7:
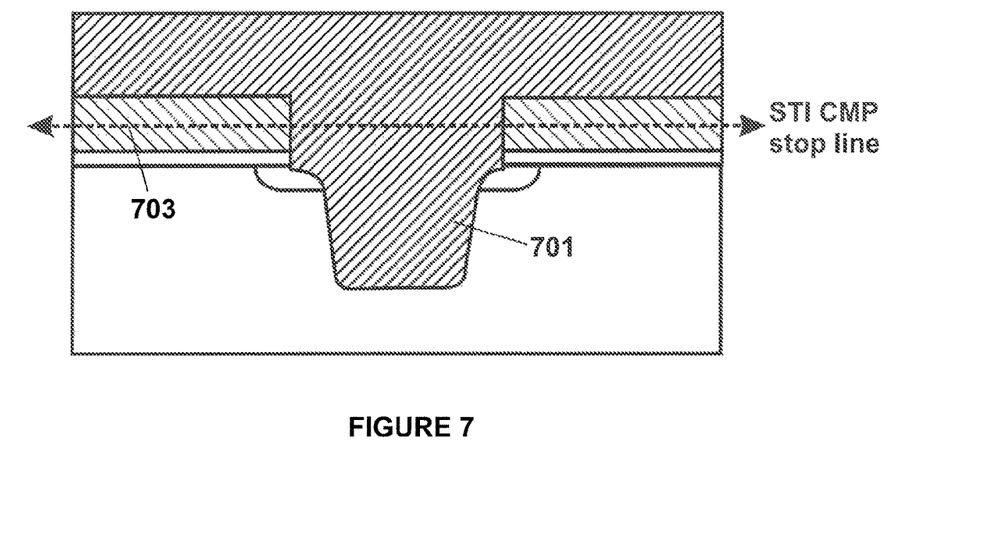
Figure 8:
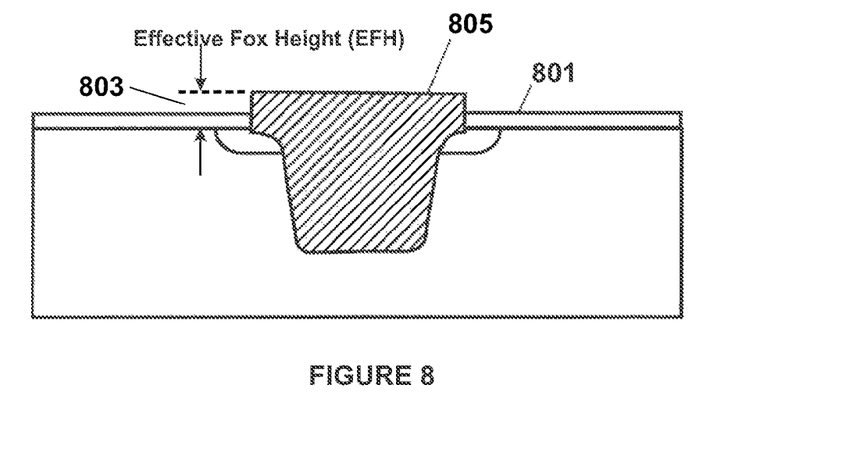

Referring to FIG. 7, the method fills the trench region with a dielectric material. In a specific embodiment, the method performs a high density plasma chemical vapor deposition (HDP-CVD) process to fill 701 the trench region with the dielectric material. The dielectric material can be any suitable insulating material such as silicon oxide, and others. Reference numeral 703 illustrates a region where a chemical mechanical polishing process stops. Next, the method planarizes via chemical mechanical polishing the insulating layer from the high density plasma chemical vapor deposition process to expose the patterned pad nitride layer. The patterned pad nitride layer is then stripped. As shown, the insulating fill material has an effective height 803 from substrate surface, which is higher than the pad oxide layer. That is, surface region 805 of the insulating fill material protrudes at an elevation above the surface region 801 of the buffered oxide layer.

Figure 9:
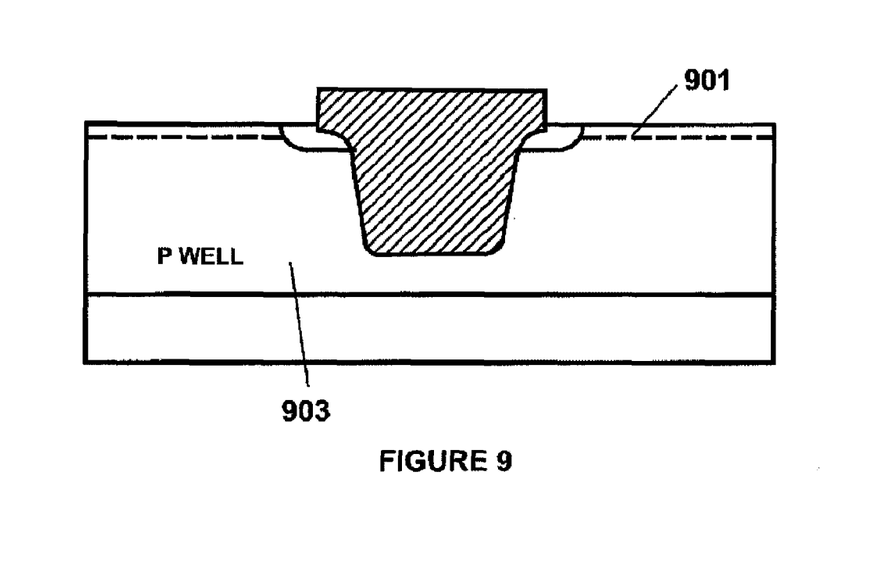
Figure 10:
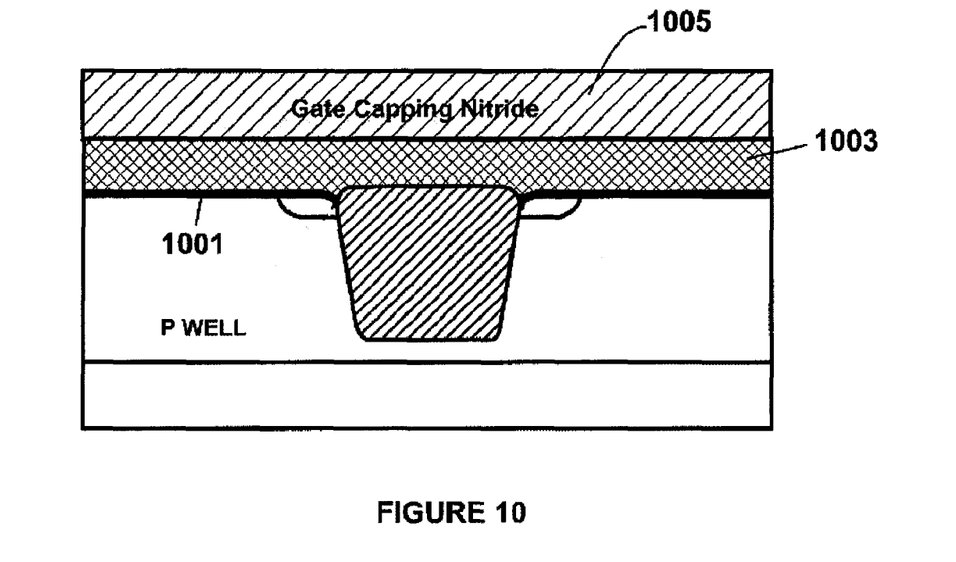

Referring to FIG. 9, the method forms P-well regions 903 within the semiconductor substrate. In a specific embodiment, the P-well regions use a boron bearing species is provided with $10 \times 10^{12}$ atoms/cm$^2$ at an energy of about 150 to 250 keV. The method also forms channel regions 901 using boron bearing species within the semiconductor substrate. In a specific embodiment, the channel regions are provided with a concentration of about $1.5 \times 10^{13}$ atoms/cm$^2$ at an energy of ranging from about 30 keV to about 40 keV. Preferably, the implanted region has a selected concentration of more than double an amount of impurities implanted into the channel region. The method includes a gate oxide pre-cleaning process, which is followed by thermal oxidation for the gate oxide layer 1001. A gate electrode region 1003 is overlying the gate oxide layer. A nitride capping layer 1005 is formed overlying the gate electrode region. Other steps are used to finish the semiconductor integrated circuit. Details of a top-view diagram of the structure of FIG. 10 are provided below.

Figure 11:
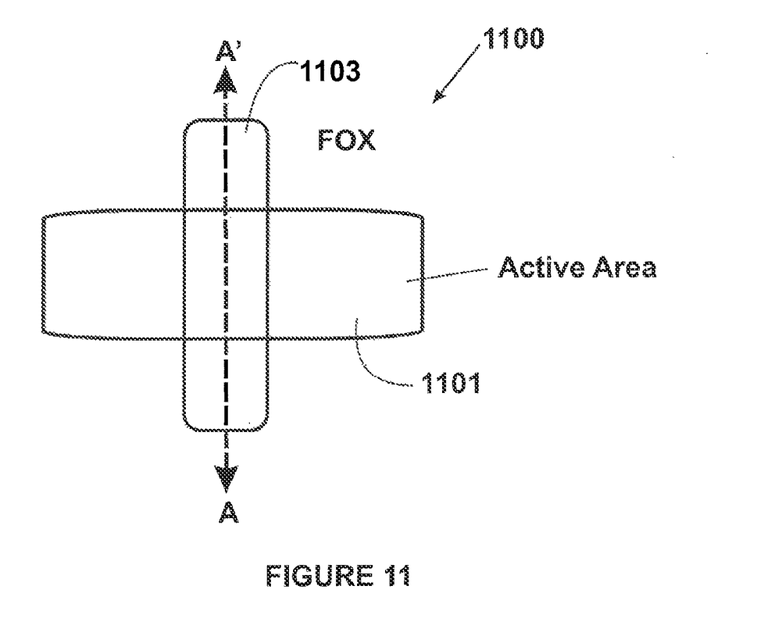
FIG. 11 is a simplified top-view diagram of an isolation structure according to an embodiment of the present invention.

FIG. 11 is a simplified top-view diagram 1100 of an isolation structure according to an embodiment of the present invention. This diagram is merely an example that should not unduly limit the scope of the claims herein. One of ordinary skill in the art would recognize other variations, modifications, and alternatives. As shown, the isolation structure 1100 surrounds active area 1101. A gate electrode 1103 traverses across the active area and a portion of the isolation structure. Reference line A to A' illustrates a cross-sectional view of the prior drawings. The present method provides a resulting device that is substantially free from limitations of conventional techniques.

Figure 12:
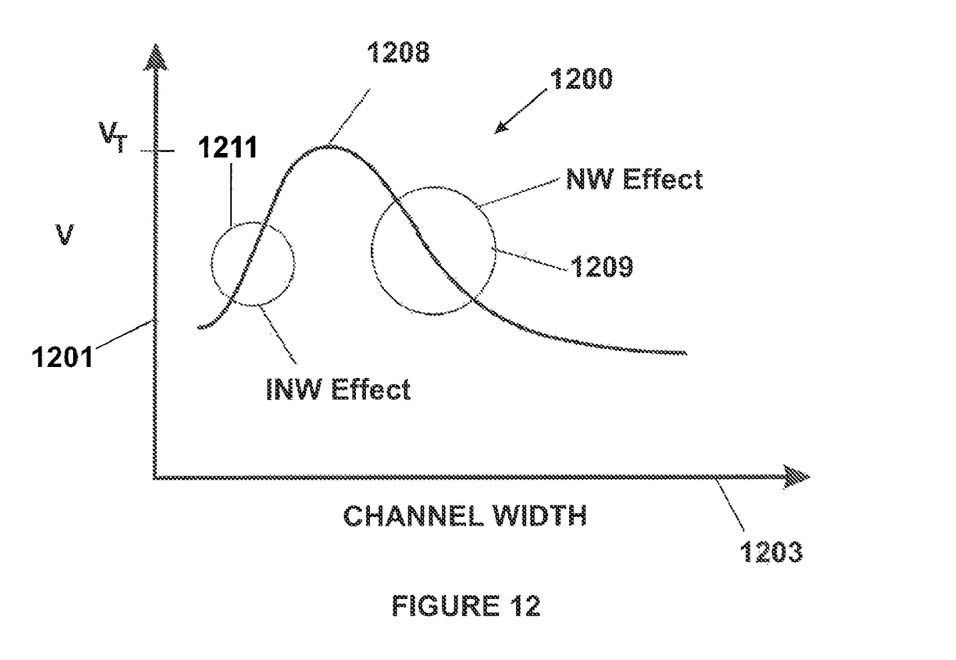
FIG. 12 is a simplified diagram of a plot of threshold voltage against channel width for a dynamic random access memory cell according to an embodiment of the present invention

FIG. 12 is a simplified diagram of a plot 1200 of threshold voltage against channel width for a dynamic random access memory cell according to an embodiment of the present invention. This diagram is merely an example that should not unduly limit the scope of the claims herein. One of ordinary skill in the art would recognize other variations, modifications, and alternatives. As shown, the diagram includes voltage along a vertical axis 1201 plotted against channel width in a horizontal axis 1203. The resulting structure operates at a voltage threshold Vt 1208 and does not operate in an inverse narrow width effect region 1211 or narrow width effect region 1209, which are characterized by lower voltage valuations. Preferably, the present implanted region maintains a threshold voltage of a resulting transistor of about 200 millivolt and free from an inverse narrow width effect influence.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for a shallow trench isolation structure for integrated circuits, the method comprising:

providing a semiconductor substrate;

forming a buffered oxide layer overlying the semiconductor substrate;

forming a pad nitride layer overlying the buffered oxide layer;

patterning the pad nitride layer to expose a portion of the semiconductor substrate corresponding to a trench region;

implanting P-type material into a portion of the semiconductor substrate using the patterned pad nitride layer as a protective mask layer while using an angle of implanting of less than 45 degrees to form an implanted region around a perimeter of the trench region within the portion of the semiconductor substrate;

forming a blanket layer of oxide material overlying the patterned nitride layer and implanted region of the semiconductor substrate;

selectively removing the blanket layer of the oxide material to leave side wall spacers on edges of the pad nitride layer facing the exposed portion of the semiconductor substrate;

using the patterned pad nitride and the side wall spacers as a protective layer;

etching the exposed portion of the semiconductor substrate to form a trench region within the semiconductor substrate while using the patterned pad nitride and the side wall spacers as the protective layer, the trench region including sharp edge regions defining the trench region on a surface of the semiconductor substrate;

selectively removing the side wall spacers on edges of the pad nitride;

performing a soft etch on the sharp edge regions of the trench region to reduce a radius of curvature on the sharp edge regions to round the sharp edge regions;

performing a high density plasma chemical vapor deposition process to fill the trench region while a dielectric material;

planarizing the high density plasma chemical vapor deposition process dielectric material until a portion of the patterned pad nitride layer has been exposed;

stripping the patterned pad nitride layer;

forming P-well regions within the semiconductor substrate within a vicinity of the trench region; and forming channel regions using boron bearing species within the P-well regions in the semiconductor substrate, the channel regions being providing with $1.5 \times 10^{13}$ atoms/cm$^2$ at an energy of ranging from about 30 keV to about 40 keV.

2. The method of claim 1 wherein the implanting of the P-type material using boron bearing impurities is provided at 30 keV.

3. The method of claim 1 wherein the round edges have a radius of curvature of more than 0.02 um.

4. The method of claim 1 wherein the soft etch comprises a plasma etching process using fluorine bearing species.

5. The method of claim 1 further comprising forming gate structures on the channel regions.

6. The method of claim 5 further comprising forming a capping nitride layer overlying the gate structures.

7. The method of claim 1 wherein the trench region has a depth of no greater than 2500 Angstroms and a bottom width of at less than 0.13 microns and an upper width of less than 0.13 microns.

8. The method of claim 1 further comprising wet etching the high density plasma chemical vapor deposition material to reduce a height to a region within a vicinity of an upper surface of the semiconductor substrate.

9. The method of claim 1 wherein the implanted region maintains a threshold voltage of a resulting transistor of about 200 millivolt to is free from an inverse narrow width effect influence.

10. The method of claim 1 wherein the implanted region has a concentration of more than double an amount of impurities implanted for the channel region.

11. The method of claim 1 wherein the P-well regions using a boron bearing species is provided with $10 \times 10^{12}$ atoms/cm$^2$ at an energy of about 150 to 250 keV.

12. A method for a shallow trench isolation structure for integrated circuits, the method comprising:

providing a semiconductor substrate;

forming a buffered oxide layer overlying the semiconductor substrate;

forming a pad nitride layer overlying the buffered oxide layer;

patterning the pad nitride layer to expose a portion of the semiconductor substrate corresponding to a trench region;

implanting P-type material using the patterned pad nitride layer using an angle of implanting of less than 45 degrees to form an implanted region around a perimeter of the trench region;

forming a blanket layer of oxide material overlying the patterned nitride layer and implanted region of the semiconductor substrate;

selectively removing the blanket layer of the oxide material to leave side wall spacers on edges of the pad nitride layer facing the exposed portion of the semiconductor substrate;

using the patterned pad nitride and the side wall spacers as a protective layer;

etching the exposed portion of the semiconductor substrate to form a trench region within the semiconductor substrate while using the patterned pad nitride and the side wall spacers as the protective layer, the trench region having a bottom width of less than 0.13 microns and an upper width of less than 0.13 microns;

selectively removing the side wall spacers on edges of the pad nitride;

performing a soft etch on edges of the trench region to round the edges, the rounded edges having a radius of curvature greater than about 0.02um;

performing a high density plasma chemical vapor deposition process to fill the trench region;

planarizing the high density plasma chemical vapor deposition process until a portion of the patterned pad nitride layer has been exposed;

stripping the patterned pad nitride layer;

forming P-well regions within the semiconductor substrate; and forming channel regions using boron bearing species within the semiconductor substrate, the channel regions being providing with $1.5 \times 10^{13}$ atoms/cm$^2$ at an energy of about 40 keV;

wherein the implanted region has a selected concentration of more than double an amount of impurities implanted into the channel region.

13. The method of claim 12 wherein the implanting is provided at 30 keV.

14. The method of claim 12 wherein the soft etch comprises a plasma etching process using fluorine bearing species, whereupon the soft etch removes less than 500 Angstroms of a portion of the semiconductor substrate.

15. The method of claim 12 further comprising performing an anneal process after implanting P-type material, the anneal process including rapid thermal anneal and furnace anneal.

16. The method of claim 15 further comprising forming a capping nitride layer overlying the gate structures.

17. The method of claim 12 wherein the trench region has a depth of no greater than 2500 Angstroms and a bottom width of at less than 0.13 microns and an upper width of less than 0.13 microns.

18. The method of claim 12 further comprising wet etching the high density plasma chemical vapor deposition material to reduce a height to a region within a vicinity of an upper surface of the semiconductor substrate.

19. The method of claim 12 wherein the implanted region maintains a threshold voltage of a resulting transistor of about 200 millivolt to is free from an inverse narrow width effect influence.

* * * * *